United States Patent [19]

Card, Jr. et al.

[11] Patent Number: 5,300,402

[45] Date of Patent: *Apr. 5, 1994

[54] COMPOSITION FOR PHOTO IMAGING

[75] Inventors: Norman A. Card, Jr., Lockwood; Richard A. Day, Whitney Point, both of N.Y.; Donald H. Glatzel, New Milford, Pa.; David J. Russell, Apalachin, N.Y.

[73] Assignee: International Business Machines Corporation, Armonk, N.Y.

[*] Notice: The portion of the term of this patent subsequent to Mar. 27, 2007 has been disclaimed.

[21] Appl. No.: 730,149

[22] Filed: Jul. 15, 1991

Related U.S. Application Data

[60] Continuation-in-part of Ser. No. 632,032, Dec. 21, 1990, and a continuation-in-part of Ser. No. 632,066, Dec. 21, 1990, which is a division of Ser. No. 318,536, Mar. 3, 1989, Pat. No. 5,026,624, which is a continuation-in-part of Ser. No. 292,173, Dec. 30, 1988, Pat. No. 4,940,651, said Ser. No. 632,032, is a continuation of Ser. No. 318,536, Dec. 30, 1988.

[51] Int. Cl.$^5$ ............................................. G03C 1/725
[52] U.S. Cl. .................................... 430/280; 430/311; 522/25; 522/49; 522/53; 522/101
[58] Field of Search ................... 430/280, 311; 522/25, 522/49, 53, 101

[56] References Cited

U.S. PATENT DOCUMENTS 4,911,786  3/1990  Kindl et al. ........................ 430/317
5,026,624  6/1991  Day et al. ........................... 430/280

Primary Examiner—Marion E. McCamish
Assistant Examiner—Mark A. Chapman
Attorney, Agent, or Firm—Calfee, Halter & Griswold

[57] ABSTRACT

An improved photoimagable cationically polymerizable epoxy based coating material is provided. The material includes an epoxy resin system consisting essentially of between about 10% and about 80% by weight of a polyol resin which is a condensation product of epichlorohydrin and bisphenol A having a molecular weight of between about 40,000 and 130,000; between about 20% and about 90% by weight of an epoxidized octafunctional bisphenol A formaldehyde novolak resin having a molecular weight of 4,000 to 10,000; and if flame retardancy is required between about 35% and 50% by weight of an epoxidized glycidyl ether of tetrabromo bisphenol A having a softening point of between about 60 C. and about 110 C. and a molecular weight of between about 600 and 2,500. To this resin system is added about 0.1 to about 15 parts by weight per 100 parts of resin of a cationic photoinitiator capable of initiating polymerization of said epoxidized resin system upon exposure to actinic radiation; the system being further characterized by having an absorbance of light in the 330 to 700 nm region of less than 0.1 for a 2.0 mil thick film, and an effective amount of thixatropic agent. Optionally a photosensitizer such as perylene and its derivatives or anthracene and its derivatives may be added.

14 Claims, No Drawings

COMPOSITION FOR PHOTO IMAGING

This is a continuation-in-part of copending U.S. application Ser. No. 07/632,032, filed Dec. 21, 1990, which is a continuation of U.S. application Ser. No. 07/318,536, filed Mar. 3, 1989 which issued as U.S. Pat. No. 5,026,624 on Jun. 25, 1991; this is also a continuation-in-part of U.S. application Ser. No. 07/632,066, filed Dec. 21, 1990, which is a division of U.S. application Ser. No. 07/318,536, filed Mar. 3, 1989 which issued as U.S. Pat. No. 5,026,624 on Jun. 25, 1991; this latter application is also a continuation-in-part of U.S. application Ser. No. 292,173, filed Dec. 30, 1988, which issued as U.S. Pat. No. 4,940,651, issued Jul. 10, 1990.

FIELD OF THE INVENTION

This invention relates generally to photoimagable compositions, and more particularly to a cationically polymerizable epoxy resin system having photoinitiators and optionally photosensitizers added thereto which resin system has improved rheological properties and also improved photoimaging properties.

BACKGROUND OF THE INVENTION

There are many different instances where photoimagable compositions are utilized in various industrial processes. In one particular process a photoimageable composition is utilized as a solder mask by applying the composition to the underlying printed circuit board. Thereafter, photolithographic techniques are employed to reveal various underlying structures on the board while masking others so that solder may be applied by various solder applying processes to the exposed structures. During the solder applying process the solder will adhere to the exposed underlying components and be prevented from adhering where the remaining material operates as a solder mask.

It is necessary that the solder mask material be formulated such that it can be applied by the appropriate methods; for example curtain coating, a preferred method, requires certain rheological properties for effective coating. Further, the solder mask must have the properties of providing efficient transmission of the light or other exposing radiation so as to photolyze the photoinitiator through whatever thickness of material is applied. Also, of course, if the material is to be used as a solder mask, the solder mask must possess appropriate physical and chemical properties to withstand the application of the solder material without significant deterioration or degradation and maintain its coverage over the portions of the board wherein solder is to be masked. If it is to be used for other purposes, other properties may be required.

There have been many prior art proposals for different photoimageable compositions including many that use epoxies. Examples of these are found in the following U.S. Pat. Nos.: 4,279,985; 4,548,890; 4,351,708; 4,138,255; 4,069,055; 4,250,053; 4,058,401; 4,659,649; 4,544,623; 4,684,671; 4,624,912; 4,175,963; 4,081,276; 4,693,961; and 4,442,197. All of these patents show various resins and photoinitiators for use in photoimageable compositions many of which are useful as solder masks. However none of them teach or suggest the specific composition of the present invention.

SUMMARY OF THE INVENTION

According to the present invention, an improved photoimagable cationically polymerizable epoxy based coating material is provided. The material includes an epoxy resin system consisting essentially of between about 10% and about 80% by weight of a high molecular weight polyol resin such as a polyol resin which is a condensation product of epichlorohydrin and bisphenol A having a molecular weight of between about 40,000 and 130,000; up to about 90% by weight of a medium molecular weight poly epoxy resin such as an epoxidized octafunctional bisphenol A formaldehyde novolak resin having a molecular weight of 4,000 to 10,000; and preferably between about 35% and 90% by weight of low molecular weight brominated epoxy resin such as an epoxidized glycidyl ether of tetrabromo bisphenol A having melting point of between about 90° C. and about 110° C. and a molecular weight of between about 600 and 2,500 if flame retardant properties are desired. To this resin system is added about 0.1 to about 15 parts by weight per 100 parts of resin of a cationic photoinitiator capable of initiating polymerization of said epoxidized resin system upon exposure to actinic radiation; optionally a photosensitizer in an amount of up to about 10 parts by weight may be added to enable/enhance exposure at desirable wave lengths; and resin system exclusive of the photoinitiator and sensitizer being further characterized by having an absorbance of light in the 330 to 700 nm region of less than 0.1 for a 2.0 mil thick film.

DESCRIPTION OF THE PREFERRED EMBODIMENT

The present invention provides a photoimageable coating material which incorporates a cationically polymerizable epoxy resin system having a photoinitiator and optionally a photosensitizer therein. The system in one embodiment was specifically developed for application by curtain coating techniques and for use as a solder mask on a printed circuit substrate. However, the system can be used for other applications, such as an etch mask, and also can be coated by other techniques such as roller coating. In another embodiment the system is specifically adopted for screen coating. In one particular solder mask application, the photoimageable material is typically curtain coated by conventional curtain coating techniques onto a substrate to a thickness of about 0.5 to about 4.0 mils or more, dried, photoimaged and developed. The developed areas reveal the desired underlying metalized portions of the substrate wherein solder is to be applied, an the remaining solder mask material is cured and remains on the board as a solder mask during the application of solder by any conventional technique. Thus the system of this invention must have satisfactory rheological properties for application by curtain coating or screen coating techniques, it must be sensitive to exposure to radiation in the region in which the photoinitiator is photoactive; and it must also have the necessary physical and chemical properties to resist degradation during the soldering process. Conventionally the solder mask remains on the board after soldering and hence for many applications must be fire or flame retardant. In formulating such a coating there are many competing considerations that must be considered in order to provide a desired end product. No specific type of material has been found which will satisfy all of the various requirements; however, a formulation of a combination or mixture of various epoxy resins according to this invention provides the required properties for a coatable photoimageable flame retardant solder mask composition.

In general, the epoxy resin system consists essentially of a phenoxy polyol resin of a high molecular weight which is a condensation product between epichlorohydrin and bisphenol A. A suitable resin of this type is sold by Union Carbide Corporation under the Trade Mark PKHC. This resin has an epoxide value of about 0.03 equivalents per kg, a weight per epoxide of about 37,000, and a Tg (glass transition temperature) of about 98° C. The second resin in the system is a poly epoxy resin such as an epoxidized octafunctional bisphenol A formaldehyde novolak resin with a medium range molecular weight. A suitable resin of this type is sold by Rhone-Poulenc of Louisville, Ky. under the Trade Mark EpiRez SU-8. This resin has an epoxide value of about 4.7 equivalents per kg, a weight per epoxide of about 215 and a melting point of about 82° C. These two resins will provide the necessary rheological, photolithographic and physical properties necessary to curtain coat for solder mask applications. However, in many instances, flame retardancy is desirable, and these two resins do not exhibit adequate flame retardancy for many applications. In such cases, a third resin in the system is a low molecular weight high softening point brominated epoxy resin such as an epoxidized glycidyl ether of tetrabromo bisphenol A. A suitable resin of this type is also sold by Rhone-Poulenc of Louisville, Ky. under the trademark EpiRez 5183. This resin has an epoxide value of about 1.5 equivalents per kg, a weight per epoxide of about 675, and a melting point of about 97° C. The different epoxy resins described above, selected to be within certain molecular weight ranges, are blended in certain percentages. A photoinitiator such as various sulfonium salts, iodonium salts, and ferrocene salts is added to the resin system for providing the proper photoresponse to actinic radiation. Since the resin system is cationically photocurable, the photoinitiator must be capable of causing cationic polymerization of the resin upon exposure to radiation. One particularly desirable photoinitiator is a complex triarylsulfonium hexafluoroantimonate salt sold by General Electric Company under the Trade Mark UVE 1014. Other photoinitiators such triphenylsulfonium hexafluorophosphate salts sold by 3M under the Trade Mark FX512, and diphenyliodonium hexafluoroantimonate may be used. Optionally a photosensitizer such as anthracene or its derivatives or perylene or its derivatives can also be added which may increase the response speed of photoimaging and/or the wave length sensitivity.

It has been found generally that from about 10% to 80% of the polyol resin is preferred with the molecular weight being generally in the range of 40,000 to 130,000, and up to 90% of the epoxidized novolak resin is preferred with a molecular weight of between about 4,000 and 10,000. This is the most general case in which flame retardancy is not a criterion. However, flame retardancy is quite often a desirable if not required property. In such cases, it has been found that generally about 20% to 40% and preferably 25% to 35% of the polyol resin can be used with the molecular weight being generally in the range of 40,000 to 130,000 and more specifically and preferably in the range of 60,000 to 90,000. About 25% to 35% and preferably 25% to 30% of the epoxidized novolak resin can be used with a molecular weight generally of about 4,000 to 10,000 and preferably from about 5,000 to 7,000. About 35% to 65% epoxidized brominated bisphenol A is desirable and more preferably about 40% to 45% within molecular weight of generally about 600 to 2,500 and preferably about 1,000 to 1,700 can be used. The photoinitiator, and optionally if desired the photosensitizer is added to the resin system. From about 0.1 to about 15 parts by weight of the photoinitiator based on 100 parts of the resin system are normally what is required and optionally up to about 10 parts by weight of a photosensitizer based on 100 parts of the resin system can be used.

The specific composition is selected to optimize the desired properties. For example, the PKHC controls the rheology of the coated materials, the 5183 imparts flame retardant properties to the material, and the SU-8 imparts fast photo speed and improved resolution. In selecting the specific amount of each resin it will of course be understood that by increasing the concentration of any one of the resins, this would also increase the respective property associated with it; however, increasing the concentration of any one of the specific resins would require a decrease in the concentration of one or both of the remaining resins which would result in a decrease of the function of the specific properties associated therewith. A decrease in any of the resins below the broad range percentages indicated above would result in properties which are unacceptable for the specific purpose of curtain coatable or alternatively screen coatable flame retardant high resolution photoimageable solder mask material.

As the PKHC amount is decreased, the resulting rheology results in a reduced coverage when the material is applied and the resulting material is extremely brittle. By reducing the 5183, the resulting system has decreased flame retardant characteristics and, if present below the minimum specified broad range, the flame retardant qualities would not meet certain specified industry requirements, e.g. UL 94 VO Flammability Requirements. However, any amount of the 5183 does provide some flame retardant characteristics. When the SU-8 concentration is reduced, a slower photospeed and lower resolution results in balancing the formulation of the material, all of these requirements must be considered and the end product optimized to give satisfactory properties for the result desired.

The following formulations were found to perform very well as solder mask compositions:

TABLE I

| Example | PKHC* | EpiRez* 5143 | SU-8* | UVE** | Tg(a) | Tg(b) Coated | Log G'(a)(c) at 100° C. | Tg(b) (cured) |
| --- | --- | --- | --- | --- | --- | --- | --- | --- |
| 1 | 20.0 | 50.0 | 30.0 | 5 | 73 | — | 5.5 | — |
| 2 | 27.3 | 45.4 | 27.3 | 5 | 75 | — | 5.9 | — |
| 3 | 33.3 | 41.7 | 25.5 | 5 | 78 | — | 6.1 | — |
| 4 | 30.0 | 45.0 | 25.0 | 5 | 78 | 54 | 6.4 | 127 |

TABLE I-continued

| Example | PKHC* | EpiRez* 5143 | SU-8* | UVE** | Tg(a) | Tg(b) Coated | Log G'(a)(c) at 100° C. | Tg(b) (cured) |
|---|---|---|---|---|---|---|---|---|
| 5 | 40.0 | 60.0 | — | 5 | — | 60 | — | 120 |

*% by weight
**parts per hundred parts resin, by weight
(a) Determined by a Rheometrics Dynamic Spectrometer, Model 7700 with 1" parallel plates.
(b) Determined using a Perkin-Elmer DSC7.
(c) This is the log of the storage modulus @ 100° C.

Each example was mixed in a propylene glycol monomethyl ether acetate (PGMEA) solvent, these formulations being about 40% solids in the PGMEA. Each of these particular formulations in this solvent coated very well onto a circuit board. However, other moderately polar solvents can be used such as propylene glycol monomethyl ether, 2-methoxyethanol, 2-methoxyethyl acetate, 2-ethxyethyl acetate, N-methyl pyrrolidone, propylene carbonate, or gamma butyrolactone.

The preferred formulation for a solder mask is in Example 4.

The following curtain coating techniques were used involving the application of the photoimageable material to a substrate via a free falling "curtain" of material. As the substrate passes through the curtain, it is coated with the material. The curtain coating set-up includes a pan, pump, viscosity controller, and a coating head. The material to be coated is pumped from the pan to the coating head, where the curtain is formed. This curtain falls back down into the pan, recirculating constantly, with exception of the material deposited onto substrates as they pass through the curtain. The coating viscosities range from 200–2,000 Cps, and typically dried film thicknesses deposited on the substrate range from 0.5–4.0 mils.

Other types of coating, such as roll coating and wound wire rod coating, can also be used. Particular formulations for screen coating will be described presently.

These particular formulations of epoxy resins and photoinitiators coated extremely well be the curtain coating methods without any spaces or gaps and covered the circuit board to a thickness of about 2 mils. During the photoimaging process, the light penetrated essentially completely through the coating to the underlying structure; thus the coating exclusive of the photoinitiator and sensitizer was transparent to this particular light, i.e. had an absorbance of less than 0.1 for the 2.0 mil thick film.

The solder mask material was exposed to UV radiation from a medium pressure mercury lamp. The UV radiation was passed through a phototool which is opaque in those area where the solder mask is to be removed. After exposure to UV radiation, the circuit boards were baked for a short time to accelerate the crosslinking reaction initiated by the sulfonium salt photolysis products. Bake temperatures between 100° C. and 150° C. and times between 2 and 20 minutes were used. The solder mask was then developed using a solvent that easily dissolves any unexposed material. One such developer is DY90 sold by Ciba-Geigy which contains gamma Bulyrolactone, Propylene Carbonate, and Diglyme; however, Butyrolactone alone works well as a developer. Spray developing equipment and other physical agitation of developer solution was used. Curing of the solder mask was accomplished by exposing the solder mask to radiation followed by an oven bake at 150° C. UV light doses varied from 1 to 4 Joules/sq cm. Bake times varied from 30 to 90 minutes. The Tg values as applied and as cured are shown for some examples in Table I.

After removing surface oxides such as with a dilute HCl rinse and applying an antioxidant such as benzotriazole, circuit boards can be soldered using a variety of methods. Two of the processes used with the solder mask described here are wave solder and vapor phase solder.

Wave solder involves placing components onto the circuit board, coating the metallic surfaces to be soldered with a flux and passing this assembly through a continuously flowing wave of molten solder. Vapor phase solder is accomplished by applying flux and solid solder to the exposed metallic surfaces on the board by screening or some other appropriate technique. After placing components on the board the assembly is passed through a vapor which is maintained at a temperature above the melting point of the solder.

Sample 4 was tested for solderability in a conventional manner using the following "solder shocking" test which is a common method of testing solder mask performance under typical soldering stresses seen in industrial processes.

The coated substrate is photoimaged, developed, and fully cured. The part is submersed in molten solder, maintained at 500° F.±25°, for 10–20 seconds. After the submersion into the solder, the part is allowed to cool to room temperature, and the inspected. Visual inspection for cracking, flaking, blistering, or noticeable degradation of the material is performed. If the solder shock does not physically degrade the material, as confirmed by visual inspection, then the solder mask passes the solder shock test criteria.

For some applications, certain additives to the formulation may be desired. For example, a fluorescent or color dye may be added for inspection or cosmetic purposes. These would be present normally in quantities of about 0.001 to about 1 part per 100 by weight. Examples of these types that have been used are malachite green oxalate, ethyl violet, and rhodamine B. Additionally for some coating applications, it may be desirable to use a surfactant, e.g. Fluorad FC 430 sold by 3M Corp. The Surfactant will normally be present in quantities of 0.01 to 1 part per 100 by weight. It will, of course, be understood that the additive must not significantly degrade the other properties of the coating. Table II below shows several examples of the preferred embodiment with various additives.

TABLE II

| Exam. | PKHC[a] | 5183[a] | SU-8[a] | UVE[b] 1014 | Surfactant[b,c] | DYE[b] |
|---|---|---|---|---|---|---|
| 5 | 30 | 45 | 25 | 5 | 0.03 | — |
| 6 | 30 | 45 | 25 | 5 | — | 0.05* |
| 7 | 30 | 45 | 25 | 5 | 0.03 | 0.05* |
| 8 | 30 | 45 | 25 | 5 | — | 0.05** |

TABLE II-continued

| Exam. | PKHC[a] | 5183[a] | SU-8[a] | UVE[b] 1014 | Surfactant[b,c] | DYE[b] |
|---|---|---|---|---|---|---|
| 9 | 30 | 45 | 25 | 5 | 0.03 | 0.05** |

NOTES:
[a]Percentage by weight.
[b]Parts per hundred parts resin, by weight.
[c]Fluorad FC 430.
*Malachite Green
**Ethyl Violate Table III shows three examples where just PKHC and SU8 are utilized. These are useful where flame retardancy is not required.

TABLE III

| Exam. | PKHC(a) | SU-8(a) | Log G' @ 100° C. |
|---|---|---|---|
| 10 | 50 | 50 | 6.3 |
| 11 | 73 | 27 | 6.7 |
| 12 | 25 | 75 | 4.3 |

(a)Percentage by weight.

Examples 10 and 11 have good characteristics for curtain coating and use as a solder mask. While example 12 has generally good properties it has a rather low Log G' at 100° C. With a value this low, it is not particularly useful in solder mask applications since it has reduced conformal properties, but it will find use in other applications.

Various other types of resin formulations were found to be unsatisfactory either rheologically and/or photolithographically as a curtain coatable photoimageable solder mask.

This invention has been described so far specifically as a formulation for curtain coating solder mask material. However, it can be used for other purposes and may be applied by various other techniques, such as roller coating. Where different uses and coating techniques are employed, certain modifications of the preferred material may be necessary to meet different requirements. For example, a different solvent or viscosity may be desired for roller coating or spray coating as opposed to curtain coating and the rheological properties may be varied from the optimum for curtain coating for the different types of uses.

If it is desired to screen coat this type of photoimaging material, it has been found that this can be best accomplished by adding a thixotropic agent to the material to modify the rheology thereof and make it suitable for screening onto a substrate using conventional screening techniques. The addition of a thixotropic agent to a composition having the other desired properties will provide a relatively thin, flowable substance when it is under sheer and a thicker, more gel-like substance when it is free of sheer or at a very low sheer. While several different types of thixotropes can be used, the preferred thixotropic agent is an amorphous silicon dioxide having a particle diameter of less than about 5.0 μm, preferably less than about 2.0 μm and even more preferably between about 0.001 μm and 0.5 μm. The screen coating techniques can encompass flood screening, whereby the material is coated in a continuous fashion over the substrate and subsequently photoimaged patternwise to open those areas where the solder is to be applied. Alternatively, the material may be patternwise screened onto the substrate using a screen which has areas masked off where no material is desired. One skilled in the art will recognize that these two techniques may require different optimum material viscosities and thixotropic indices. The amount of thixatrope added may vary rather widely depending upon the screening characteristics desired. In the case of silica, this can be up to about 20% by weight. With amorphous silica, the preferred range is about 1% to about 12%.

Further, as indicated above, one of the required properties of the dried film is that it have a sufficiently low absorbance of light in the range which activates the photoinitiator to allow the light to penetrate sufficiently to activate the photoinitiator all the way through the thickness of the film. More precisely, this can be viewed as a sufficiently high transmission of light energy in the photoactive range of the photoinitiator, although this can be routinely characterized as an absorbance as measured spectrophotometrically. The absorbance of the film as measured by a spectrophotometer should be less than about 2.0 per mil thickness of film in the light range of the photoactivity of the photoinitiator. One skilled in the art will recognize that some of the measured absorbance of films containing silica particles, especially those of larger diameters is due actually to light scattering rather than molecular or atomic absorbance. Expressed another way, this means that there should be at least about 1% light transmission per mil thickness of film when the film is in the range of 1-2 mils thick. However, if the film is thicker, then greater transmission, i.e. lower absorbance may be required to adequately expose the entire thickness of the film. This can be determined by routine experimentation. As indicated above, this transmission or absorbance is relevant only to the wave length necessary for activating the photoinitiator UVE 1014 alone is sensitive to radiation in the 200-370 nm wavelength range. However, most glasses or other substrates of the artwork absorb all energy below about 320 nm. In this case, the film exposed through artwork will be sensitive to radiation in the 320 to 370 nm range. For other photoinitiators and artwork substrates, the critical range for the exposed energy may be different.

It is to be understood that this absorbance measurement is measured with the film as dried after it has been screened onto a substrate and thus includes the resins and the thixotropic agent as well as the photoinitiator. Expressed another way, it is the cumulative effect of all of these constituents, i.e. resin system, photoinitiator, and thixotrope, on the absorbance which must be 2.0 or less and not any one of them individually.

In order to demonstrate the effect on the various properties of the photoimageable material, different amounts of different types of thixotropes were added to solutions of varying concentrations of a standardized resin system. The standardized resin system is as follows:

| STANDARDIZED RESIN SYSTEM | |
|---|---|
| PKHC | 28.54% |
| EpiRez 5183 | 42.81% |
| EpiRez SU-8 | 23.79% |
| UVE 1014 | 4.76% |
| Ethyl Violet | 0.07% |
| FC-430 | 0.03 |

This standardized resin system was used to mix screen coatable materials having various percentages of solvent with several different types and amounts of thixotropic agents which materials were then tested for viscosity and photoimaging properties. Table IV below shows six separate batches using the standardized resin system dissolved in PGMEA with amorphous fumed silicon dioxide sold under the tradename Aerosil A380 from Degussa Corporation added thereto as a thixotrope. The total percent of solids including the resin system, the thixotropic agent of amorphous silica and photoinitiator was about 50% solids and about 50% solvent. The viscosities were measured at 25° C. at various rpms from 1 to 100 on a Brookfield RTV Viscometer with a No. 7 Spindle. The thixotropic indexes for each of these four batches are shown. For these batches, the index is defined as the viscosity at 25° C. at .5 rpm divided by viscosity at 25° C. at 50 rpm although other ratios can be used.

TABLE IV

| | Examples[1] | | | | | |
|---|---|---|---|---|---|---|
| RPM[2] | 13 | 14 | 15 | 16 | 17 | 18 |
| | Viscosity at 25° C., ccs | | | | | |
| 1 | 720,000 | 640,000 | 600,000 | 500,000 | — | — |
| 5 | 200,000 | 192,000 | 164,000 | 140,000 | 204,000 | 168,000 |
| 10 | 116,000 | 112,000 | 98,000 | 82,000 | — | — |
| 20 | 71,000 | 71,000 | 61,000 | 50,000 | — | — |
| 50 | 40,000 | 40,000 | 34,000 | 27,000 | 41,000 | 44,000 |
| 100 | 28,500 | — | 23,200 | 18,600 | — | — |
| 1 | 620,000 | 560,000 | 540,000 | 500,000 | — | — |
| Thixotropic Index | | | | | | |
| | 5.0 | 4.8 | 4.82 | 5.02 | 4.8 | 3.8 |

[1] All examples used the Standardized Resin System dissolved in PGMEA with Aerosil A380 added in a total percentage (including solvent) of 3% and the total solids including resin system, photoinitiator and thixotrope being 50% with 50% solvent.
[2] The RPMs of a Brookfield RTV viscometer No. 7 Spindle at which viscosities were measured.

Table IV demonstrates that there can be a certain amount of variation in thixotropy between the low and high rpm measurements and also in the thixotropic index even with batches which nominally contain the same amount ingredients. This variation can be due to different mixing conditions as well as inherent variations in the material.

Table V below shows a batch of the same preferred resin system mixed with 3.5% Aerosil A380 but with a total of only about 47% total solids including resin systems, photoinitiators and thixotropes, and about 53% solvent. As can be seen in Table IV, increasing the amount of thixotrope from 3.0% to 3.5% and decreasing the total amount of solids, there is still a significant increase in actual viscosity at low rpm and a decrease at higher rpm as well as an increase in the thixotropic index to 8.3.

TABLE V

| | Example 19 |
|---|---|
| RPM/Example | Viscosity at 25% |
| 1 | 1,000,000 |
| 5 | 216,000 |
| 10 | 110,000 |
| 20 | 57,000 |
| 50 | 26,000 |
| 100 | 15,600 |
| 1 | 1,020,000 |
| Thixotropic Index | 8.3 |

The compositions of Table IV and V are all generally suitable for flood screen coating. Example 19 is preferred over the examples in Table IV for pattern screening. In the case of pattern screening, the desired pattern is screened onto the substrate. The patterned coating is then dried and cured.

Compositions having percentages of different types of thixotropes added to a slightly modified standardized resin system, are shown in Table VI below. (In this resin system, malachite green oxalate was substituted for ethyl violet as the dye but in all other aspects, the resins together with the other additives including the photoinitiator was the same as the standardized resin system described above). In each of these compositions, in the base formulation, there was 4.76% of UVE 1014 as solids and 41% of total solids with the percentage of thixotrope added shown as a percent of the total system including the resin systems, photoinitiator and PMGEA solvent. Table VI shows the particular additive percent.

TABLE VI

| Example | Additive | Percent[9] |
|---|---|---|
| 20 | A380[1] | 3 |
| 21 | A300[2] | 3 |
| 22 | R974[3] | 5 |
| 23 | R972[4] | 5 |
| 24 | R202[5] | 5 |
| 25 | TS720[6] | 5 |
| 26 | TS710[7] | 5 |
| 27 | HDK-N20[8] | 5 |
| 28 | A300[2] | 3.65 |
| 29 | A380[1] | 2 |
| 30 | A380[1] | 3 |
| 31 | R974[3] | 8.3 |
| 32 | R974[3] + A300[2] | 5 + 2 |

[1] A380 is a fumed silica sold by Degussa Corp.
[2] A300 is a fumed silica sold by Degussa Corp.
[3] R974 is a fumed silica with a hydrophobic surface treatment.
[4] R972 is a fumed silica with a hydrophobic surface treatment, larger particle size than R974.
[5] R202 is a fumed silica with a hydrophobic surface treatment.
[6] TS720 is a fumed silica with a hydrophobic surface treatment (Cabot Corp.).
[7] TS710 is a fumed silica with a silane hydrophobic surface treatment (Cabot Corp.).
[8] HDK-N20 is a fumed silica.
[9] percent added to total solution (solids + solvent).

Table VII below shows the viscosity of Examples 20-32 as measured on the rotating viscosimeter at 1 rpm, 100 rpm, and 1 rpm. The sequence being rotating at 1 rpm increasing to 100 rpm and then decreasing to 1 rpm to check the recovery.

TABLE VII

| | 1 rpm | 100 rpm | 1 rpm |
|---|---|---|---|
| 20 | 280,000 | 6,800 | 260,000 |
| 21 | 420,000 | 9,200 | 440,000 |
| 22 | 100,000 | 5,600 | 100,000 |
| 23 | 60,000 | 4,200 | 60,000 |
| 24 | 260,000 | 8,800 | 220,000 |
| 25 | 140,000 | 6,200 | 120,000 |
| 26 | 40,000 | 3,800 | 40,000 |
| 27 | 1,600,000 | 17,600 | 1,540,000 |
| 28 | 440,000 | 12,800 | 400,000 |
| 29 | 120,000 | 4,200 | 100,000 |
| 30 | 380,000 | 7,000 | 380,000 |
| 31 | 420,000 | 20,600 | 440,000 |
| 32 | 560,000 | 16,800 | 460,000 |

All of the above coatings were first evaluated for photoimaging properties. Examples 20, 23, 25, and 27 had only marginally acceptable photoimaging properties and therefore were not evaluated in screen coating tests since other samples were better. Examples 21, 22, 24, 26, 28, 29, 30, 31, and 32 were evaluated for photoimage resolution and screen coating properties. With respect to the resolution and photoimaging characteristics, Examples 21, 22, 23, 24, 26, 30, and 31 were preferred over the others. For screen coating characteristics, Examples 21, 24, 26, 29, and 30 are preferred over the other examples.

The overall preference based on both screening characteristics and photoprocessing characteristics and other characteristics was that 30 was the best material, 21 was second best, 28 was third.

In other experiments, it was found that the total solids including resin system, photoinitiator, and thixotrope, when the thixotrope is in the range of about 2.5% to 3.5% should not exceed about 53%, otherwise the screening process performance and coating quality degrades. Conversely, the total solids should not be less than about 40%.

Thus, it can be seen that by the addition of a thixotrope in proper amounts and with proper control and proper selection of balance between the percent solids in solution and the proper thixotrope, a material which can be screen applied to a substrate and subsequently photoimaged and developed is provided.

The exposure and developing of the photoimaging compositions can be performed substantially as indicated above. A preferred technique for photoexposing and imaging the screened embodiment is as follows: After the material has been screened onto the substrate and dried at about 88° C. for about 15 minutes as indicated above, an essentially continuous coating of a solid film results which is essentially tack free. The coating is then imagewise exposed to about 1500 mJ per square centimeter from a low pressure Hg arc lamp and then baked at about 120° for about 12 minutes in a conventional batch oven. The exposed and baked coating is developed in gamma Bulyrolactone at about 28° C. by spraying the gamma Bulyrolactone at about 3.5 BAR pressure with about a 4 minute residence time to develop the pattern. The patterned developed coating is then given an ultraviolet exposure of about 4 J per square centimeter followed by an oven bake at about 150° C. for about 60 minutes. The resulting patterned and developed coating on circuit boards has excellent solder resisting properties when used as a solder mask and tested according to the procedures indicated above.

While the invention has been described with a certain degree of particularity, various adaptations and modifications can be made without departing from the scope of the invention as defined in the appended claims.

What is claimed is:

1. A photosensitive cationically polymerizable epoxy base imaging system comprising:
    an epoxy resin system consisting essentially of between about 20% and about 60% by weight of a polyol resin which is a condensation product of epichlorohydrin and bisphenol A having a molecular weight of between about 40,000 and about 130,000;
    up to about 35% by weight of a epoxidized octafunctional bisphenol A formaldehyde novolak resin having a molecular weight of between about 4,000 and about 10,000;
    between about 35% and about 80% by weight of an epoxidized glycidyl ether of tetrabromo bisphenol A having a softening point of between about 60° C. and about 110° C. and a molecular weight of between about 600 and about 2,500; and
    from about 0.1 to about 15 parts by weight of a cationic photoinitiator capable of initiating polymerization in said epoxidized resin system upon exposure to actinic radiation;
    said resin system and said photoinitiator being disposed in a solvent;
    an effective amount of a thixotropic agent dispersed in a solvent with said resin system and said photoinitiator;
    said imaging system when dried to a film being further characterized by having an absorbance of light in the photoactive region of the photoinitiator of less than 2.0 per mil thickness of film.

2. The invention as defined in claim 1 wherein there is between about 25 and about 35 percent of the polyol resin, between about 20% and about 30% of an epoxidized octafunctional bisphenol A formaldehyde novolak resin; between about 40 and about 45% of the epoxidized glycidyl ether of tetrabromo bisphenol A resin; and between about 2 and 5 parts by weight of the cationic photoinitiator.

3. The invention as defined in claim 1 wherein the molecular weight of the polyol resin is between 60,000 and about 90,000; the molecular weight of the epoxidized octafunctional bisphenol A formaldehyde novolak resin is between about 5,000 and about 7,000 and the molecular weight of the epoxidized glycidyl ether of tetrabromo bisphenol A is between about 1,000 and about 1,700.

4. The invention as defined in claim 1 wherein an effective amount of up to 10% photosensitizer is included.

5. The invention as defined in claim 1 wherein the photoinitiator is a sulfonium salt having photoactivity in the 330 nm to 370 nm region.

6. The invention as defined in claim 1 wherein said solvent is propylene glycol monomethyl ether acetate.

7. A photosensitive cationically polymerizable epoxy based imaging system comprising:
    an epoxy resin system consisting essentially of between about 10% and about 80% by weight of a polyol resin which is a condensation product of epichlorohydrin and bisphenol A having a molecular weight of between about 40,000 and 130,000;
    between about 20% and about 90% the weight of an epoxidized octafunctional bisphenol A formaldehyde novolak resin having a molecular weight of between about 4,000 and about 10,000; and
    from about 0.1 to about 15 parts by weight of a cationic photoinitiator capable of initiating polymerization in said epoxidized resin system upon exposure to actinic radiation;
    said resin system and said photoinitiator being disposed in a solvent;
    an effective amount of a thixotropic agent dispersed in a solvent with a solvent with said resin system and said photoinitiator;
    said imaging system when dried to a film being further characterized by having an absorbance of light in the photoactive region of the photoinitiator of less than 2.0 per mil thickness of film.

8. The invention as defined in claim 7 further characterized by an effective amount up to about 50% by weight of an epoxidized glycidyl ether of tetrabromo bisphenol A resin.

9. The invention as defined in claim 7 wherein the molecular weight of the polyol resin is between about 60,000 and about 90,000; and the molccular weight of the epoxidized octafunctional bisphenol A formaldehyde novolak resin is between 5,000 and about 7,000.

10. The invention as defined in claim 7 wherein an effective amount of up to 10% of photosensitizer is included.

11. The invention as defined in claim 7 wherein the photoinitiator is a sulfonium salt having photoactivity in the 200 nm to 370 nm region.

12. The invention as defined in claim 7 wherein said solvent is propylene glycol monomethyl ether acetate.

13. A photosensitive cationically polymerizable epoxy based imaging system comprising:
   an epoxy based resin system having solids comprising between about 10% and about 80% by weight of a polyol resin of a high molecular weight and having epoxy functionality;
   between about 20% and about 90% by weight of a polyepoxy resin of a medium molecular weight;
   an effective amount up to about 50% by weight of a cationic photoinitiator capable of initiating polymerization in said epoxidized resin system upon exposure to actinic radiation;
   said resin system and said photoinitiator being disposed in a solvent;
   an effective amount of a thixotropic agent dispersed in a solvent with a solvent with said resin system and said photoinitiator;
   said imaging system when dried to a film being further characterized by having an absorbance of light in the photoactive region of the photoinitiator of less than 2.0 per mil thickness of film.

14. The imaging system as defined in claim 13 wherein the solvent is propylene glycol monomethyl ether acetate.

* * * * *